United States Patent [19]
Shin

[11] Patent Number: 5,926,415
[45] Date of Patent: Jul. 20, 1999

[54] SEMICONDUCTOR MEMORY HAVING NAND CELL ARRAY AND METHOD OF MAKING THEREOF

[75] Inventor: Bong-Jo Shin, Cheongju-si, Rep. of Korea

[73] Assignee: LG Semicon Co., Ltd., Cheongju, Rep. of Korea

[21] Appl. No.: 08/867,429

[22] Filed: Jun. 6, 1997

[30] Foreign Application Priority Data

Jun. 7, 1996 [KR] Rep. of Korea .................. 96-20184

[51] Int. Cl.[6] .................................................. G11C 16/00
[52] U.S. Cl. ........................ 365/185.17; 365/185.11; 365/63
[58] Field of Search .................. 365/185.17, 185.11, 365/230.03, 63, 72; 438/128, 129, 257

[56] References Cited

U.S. PATENT DOCUMENTS

| | | | |
|---|---|---|---|
| 4,922,459 | 5/1990 | Hidaka | 365/63 |
| 5,031,011 | 7/1991 | Aritome et al. | 257/319 |
| 5,369,608 | 11/1994 | Lim et al. | 365/185.13 |
| 5,392,238 | 2/1995 | Kirisawa | 365/230.03 |
| 5,400,279 | 3/1995 | Momodomi et al. | 365/185.17 |
| 5,429,968 | 7/1995 | Koyama | 437/48 |
| 5,483,483 | 1/1996 | Choi et al. | 365/177 |
| 5,587,948 | 12/1996 | Nakai | 365/185.17 |
| 5,682,350 | 10/1997 | Lee et al. | 365/185.17 |
| 5,835,396 | 11/1998 | Zhang | 365/63 |

OTHER PUBLICATIONS

Choi, J.D., et al., "A Novel NAND Structure With A BJT Contact For The High Density Mask ROMs,", IEEE, 1994 Symposium on VLSI Technology Digest of Technical Papers, Sect. 12.4, pp. 163–164.

*Primary Examiner*—Tan T. Nguyen
*Attorney, Agent, or Firm*—Fleshner & Kim

[57] ABSTRACT

A NAND cell memory block array includes word lines and active regions arranged in X and Y directions. When a voltage of Vcc is applied to the word lines arranged in the X direction, a voltage of −Vcc is applied to the word lines arranged in the Y direction to turn off all transistors placed under the word lines arranged in the Y direction, thereby blocking the current path of the transistor. When a voltage of Vcc is applied to the word lines arranged in the Y direction, a voltage of −Vcc is applied to the word lines arranged in the X direction to turn off all transistors placed under the word lines arranged in the X direction, thereby blocking the current path of the transistor. The memory blocks arranged in the X and Y direction interweave or interleave with each other such that integration density can be doubled.

14 Claims, 5 Drawing Sheets

SEMICONDUCTOR MEMORY HAVING NAND CELL ARRAY AND METHOD OF MAKING THEREOF

BACKGROUND OF THE INVENTION

1. Field of the Invention

The present invention relates to a semiconductor memory, and more particularly, to a read only memory having a NAND cell array.

2. Background of the Related Art

The integration density of a read only memory device has been increased from 8 mega-bits to 16 mega-bits, and a NAND type mask programmable read only memory device is attractive in view of integration density. FIG. 1 shows a part of the memory cell array incorporated in a prior art NAND type mask programmable read only memory device, and comprises a memory block 1 broken down into two memory sub-blocks 1a and 1b coupled in parallel between a bit line Y and a source line S. Though not shown in FIG. 1, the memory cell array further contains a large number of memory blocks which are arranged in rows and columns together with the memory block 1.

The memory sub-block 1a is implemented by a series combination of n-channel type switching transistors Qs1 and Qs2 and n-channel type memory transistors Qm1, Qm2 and Qm3, and the other memory sub-block 1b is also implemented by a series combination of n-channel type switching transistors Qs3 and Qs4 and n-channel type memory transistors Qm4, Qm5 and Qm6. Each of the n-channel type switching transistors Qs1 to Qs4 is operative in either enhancement or depletion mode, and doping is selectively carried out for the channel regions of the n-channel type switching transistors Qs1 to Qs4 so as to form the n-channel type depletion mode switching transistors Qs1 to Qs4.

Decoded signal lines Xs1 and Xs2 are coupled with the n-channel switching transistors Qs1 and Qs3 and with the n-channel switching transistors Qs2 and Qs4, respectively, and allows the n-channel type switching transistors Qs1 to Qs4 operative in either enhancement or depletion mode to selectively couple the memory sub-blocks 1a and 1b with the associated bit line Y. The n-channel type memory transistors Qm1 to Qm6 are also operative in either enhancement or depletion mode, and the n-channel enhancement mode memory transistors Qm1, Qm2, Qm4 and Qm6 and the n-channel depletion mode transistors Qm3 and Qm5 correspond to the logic levels opposite to each other.

In other words, the n-channel type memory transistors Qm1 to Qm6 serve as the memory cells respectively storing data bits in non-volatile manner. The enhancement mode memory transistors Qm1, Qm2, Qm4 and Qm6 are representative of data bits of logic "1" level, and the depletion mode memory transistors Qm3 and Qm5 are representative of data bits of logic "0" level. Doping selectively carried out for the channel regions also forms the depletion mode transistors. Word lines WL1, WL2 and WL3 are coupled with the n-channel type memory transistors Qm1 and Qm4, Qm2 and Qm5, and Qm3 and Qm6, and are selectively driven to positive high voltage level.

The prior art mask programmable read only memory device operates as follows. In order to select one of the memory sub-blocks 1a and 1b, the decoded signal lines Xs1 and Xs2 are selectively driven to positive high voltage level or 5 volts, and one of the decoded signal lines remains in low voltage level or zero volts. If the decoded signal line Xs1 is driven to the positive high voltage level, the memory sub-block 1b is coupled with the bit line Y. However, the decoded signal line Xs2 of the low voltage level causes the memory sub-block 1a to be isolated from the bit line Y.

Subsequently, remaining one of the word lines WL1 to WL3 in the low voltage level, the other word lines are driven to the positive high voltage level. The word line kept in the low voltage level selects one of the n-channel type memory transistors Qm1 to Qm3 from the selected memory sub-block 1a. If the selected memory transistor is operative in the depletion mode, any conductive channel takes place in the selected memory transistor, and the selected memory transistor cuts off the current path from the bit line Y to the source line S. However, the n-channel type depletion mode memory transistor allows current to flow from the bit line Y through the selected memory sub-block 1a to the source line S. Thus, the selected memory transistor either couples or block the source line from the bit line Y, and voltage level on the bit line Y is either decayed or kept depending upon the data bit represented by the selected memory transistor. The voltage level on the bit line Y is monitored to see whether the accessed data bit is either logic "1" or "0" level.

FIGS. 2 to 4 show a typical example of the NAND type mask programmable read only memory device, and the NAND type mask programmable read only memory device is fabricated on a p-type silicon substrate 2 lightly doped at $4 \times 10^{16}/cm^{-3}$. A passivation film 3 of boron phosphosilicate glass or BPSG and the bit line Y of aluminum are removed from FIG. 2 for better understanding of the layout of the prior art mask programmable read only memory device. A thick field insulating film 4 are selectively grown on the major surface of the p-type silicon substrate 2, and defines an active area 5 in the major surface of the p-type silicon substrate 2. The thick field insulating film 4 is as thick as 6000 angstroms. The field insulating film is formed in the active area 5 as a layer.

The active area 5 is covered with a gate oxide film 6 which is as thin as 250 angstroms. On the gate oxide film 6 polysilicon strips 7a, 7b, 7c, 7d and 7e of 3000 angstroms in thickness are patterned. The polysilicon strips 7a to 7e respectively serve as the decoded signal lines Xs1 and Xs2 and the word lines WL1 to WL3, and provide the gate electrodes of the n-channel type switching transistors Qs1 to Qs4 and the gate electrode of the n-channel type memory transistors Qm1 to Qm6. The active area 5 under the gate electrodes serves as channel regions CQs1 to CQs4 of the n-channel type switching transistors Qs1 to Qs4 and channel regions CQm1 to CQm6 of the n-channel type memory transistors Qm1 to Qm6, and the channel regions CQs1 to cQs4 and CQm1 to CQm6 are selectively doped with n-type impurity atoms.

In this instance, the channel regions CQm3 and CQm5 are doped with n-type impurity atoms at $1 \times 10^{17}/cm^{-3}$ so that the n-channel type memory transistors Qm3 and Qm5 is allowed to operate in the depletion mode. The other active area provides a cell drain region 5a, a cell source region 5b and source/drain regions 5c of the n-channel type switching transistors. Qs1 to Qs4 and the n-channel type memory transistors Qm1 to Qm6. The polysilicon strips 7a to 7e are covered with the passivation film 3, and a contact hole 3a is formed in the passivation film 3 and the gate oxide film 6. The contact hole thus passing through those films 3 and 6 allows the bit line Y to be held in contact with the cell drain region 5a as will be better seem from FIG. 3.

Thus, the memory cells of the prior art mask programmable read only memory device are directly arranged on the major surface of the p-type silicon substrate 2, and a problem is encountered in that the p-type silicon substrate 2 is enlarged in proportion to the number of the memory cells. In other words, when the integration density of the memory cell array is increased, the two-dimensional memory cell array requires a large-sized silicon substrate, and accordingly, decreases the production yield.

The above memory cell arrangement is described in U.S. Pat. No. 5,429,968 to Koyama. Further, similar arrangements of memory cells can be found in U.S. Pat. Nos. 5,031,011 to Aritome et al., 5,369,608 to Lim et al., 5,400,279 to Momodami et al. and 5,483,483 to Choi et al. In the arrangement of the aforementioned related and prior art NAND cell array, there is restriction in the resolution of lithography, and minimum line width. Further, as the field insulating film is formed in the active area 5 as a layer, there is limit to increase the integration of memory devices for obtaining a wider active region. Accordingly, integration of the semiconductor device is limited.

The above references are incorporated by reference herein where appropriate for appropriate teachings of additional or alternative details, features and/or technical background.

SUMMARY OF THE INVENTION

It is an object of the present invention to solve the problems of the related and prior art.

It is another object of the present invention to improve the integration of memory devices.

It is still further object of the present invention to improve the integration of memory devices by forming a small field insulating field insulating film having the shape of island at a necessary portion to obtain a wider active region.

To accomplish the object of the present invention there is provided a NAND cell memory block array comprising a plurality of first and second memory blocks being perpendicularly arranged in first and second directions respectively, each of the plurality of memory blocks having a plurality of transistors, the transistors being serially connected to one another.

The present invention may be also achieved in part or in whole by a method for forming a NAND cell memory blocks array, comprising the steps of: forming a field insulating layer in a portion of an active regions in first and second directions, the field insulating layer having the shape of island; forming an impurity region in a portion in which a depletion transistor is formed; forming a first gate or word in the first direction; forming an insulating layer, and forming a second gate or word in perpendicular to the first direction; and implanting impurities into the active region placed on both sides of the first and second gate or words, to form source and drain regions.

The present invention may be also achieved in part or in whole by a memory array comprising: a first plurality of memory blocks arranged in a first direction, and a second plurality of memory blocks arranged in a second direction, wherein each memory block includes a pair of memory sub-blocks, and each memory sub-block of the first plurality of memory blocks intersect each memory sub-block of the second plurality of memory blocks.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Unlike the prior art, both word lines $WL_{x1}$–$WL_{xn}$ and $Wl_{y1}$–$Wl_{yn}$ and active regions, e.g., 42 and 43, are arranged in X and Y directions. When a voltage of Vcc is applied to the word lines $WL_{x1}$–$WL_{xn}$ arranged in an X direction, a voltage of –Vcc is applied to the word lines $WL_{y1}$–$WL_{yn}$ arranged in the Y direction. All transistors placed under the word lines $WL_{y1}$–$WL_{yn}$ arranged in the Y direction are turned off, thereby blocking the current path of the transistor.

In the preferred case, the threshold voltage of the depletion transistor is approximately –1 V and if a voltage of –Vcc is applied to the word lines, the current path is turned off. When a voltage of Vcc is applied to the word lines $WL_{y1}$–$WL_{yn}$ arranged in the Y direction, a voltage of –Vcc is applied to the word lines $WL_{xn}$—$WL_{xn}$ arranged in the X direction to turn off all transistors placed under the word lines arranged in the X direction, thereby blocking the current path of the transistor.

In a mask ROM made with a NAND cell block array according to the present invention, in order to code data "0", the cell transistor becomes a depletion type. On the other hand, the cell transistor becomes an enhancement type in order to code data "1".

Figure 1:
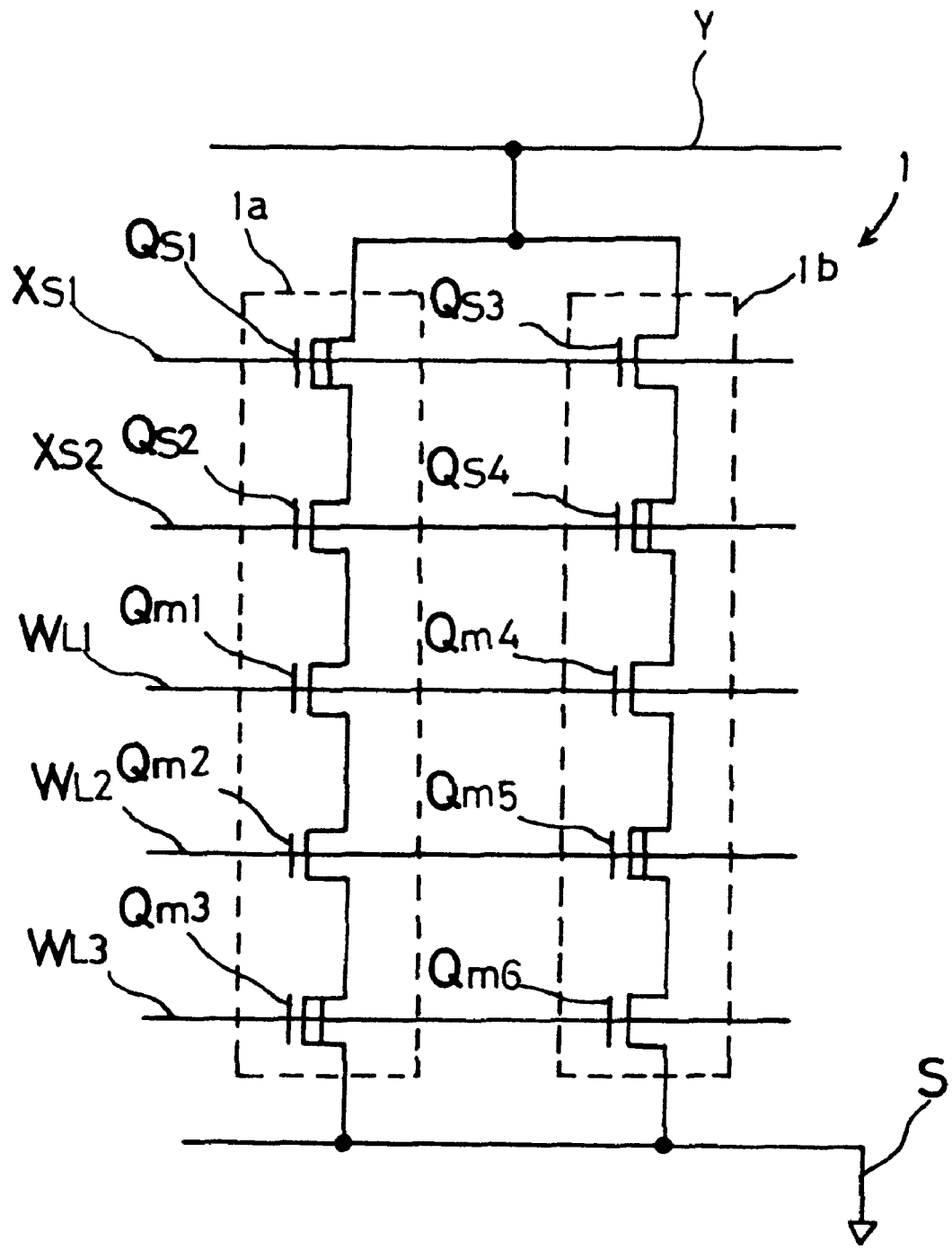
FIG. 1 is a circuit diagram showing the arrangement of a semiconductor memory with NAND cells.
Figure 2:
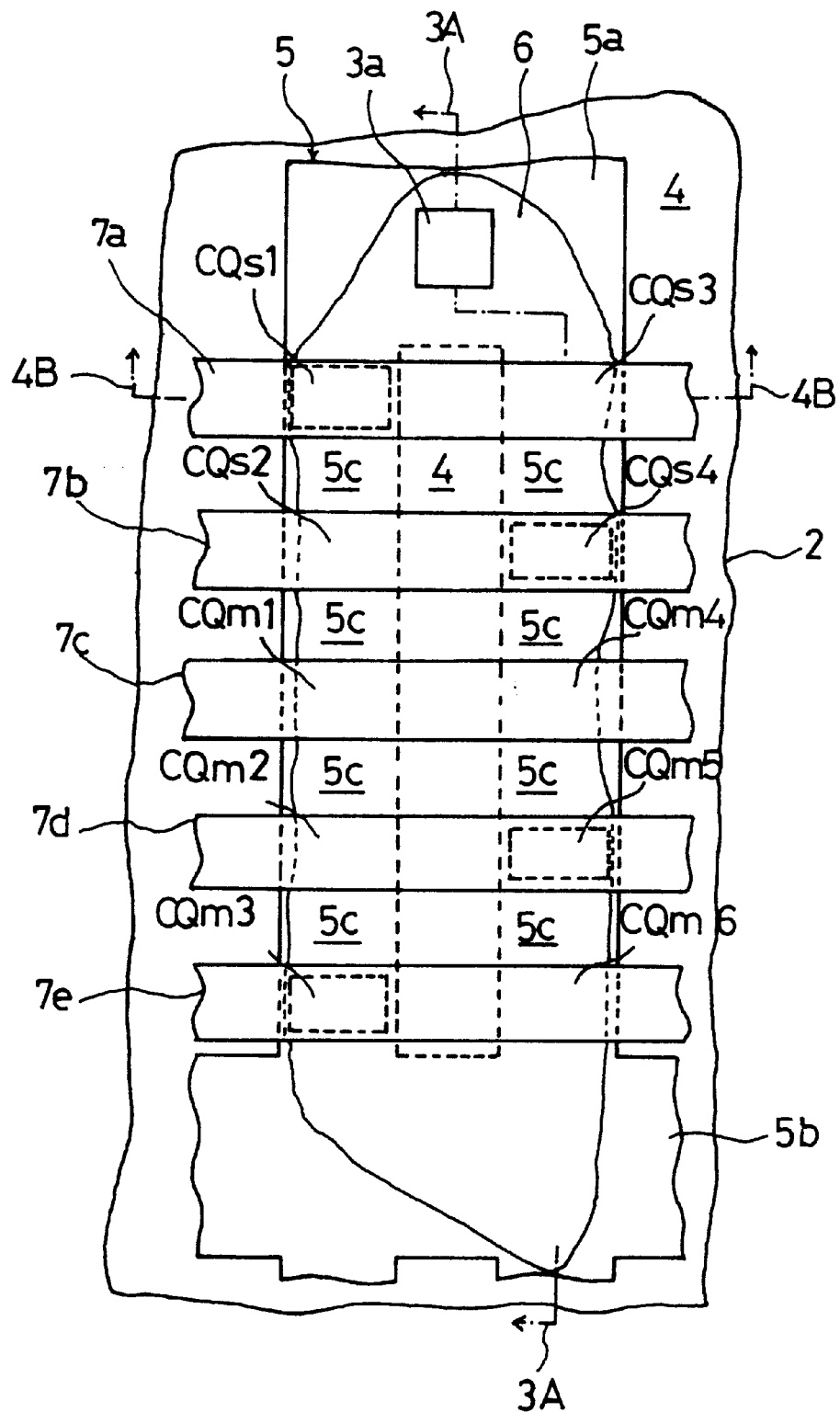
FIG. 2 is a plan view of the semiconductor memory illustrated in FIG. 1.
Figure 3:
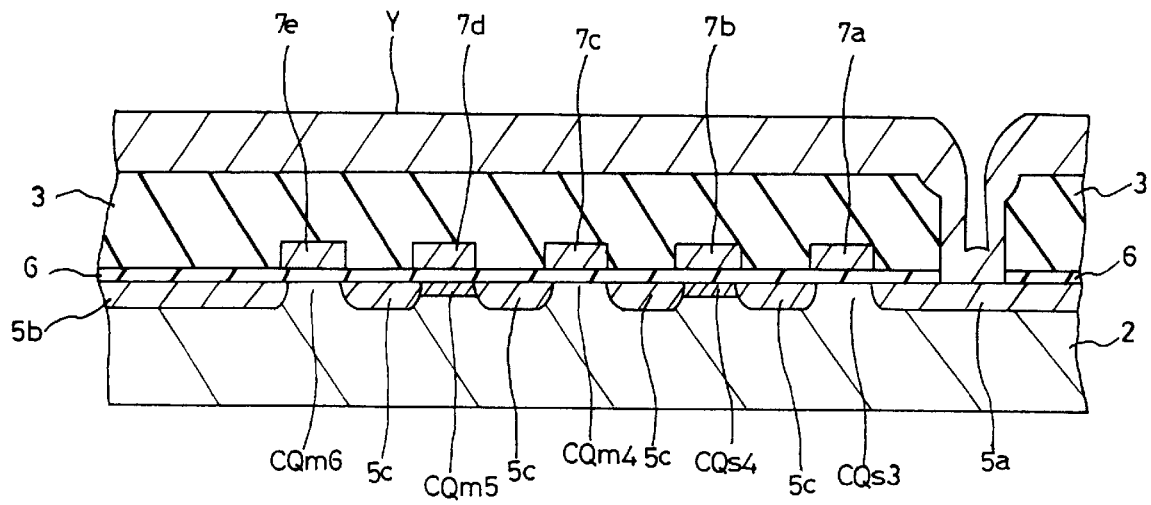
FIG. 3 is a cross-sectional view taken along line A—A of FIG. 2.
Figure 4:
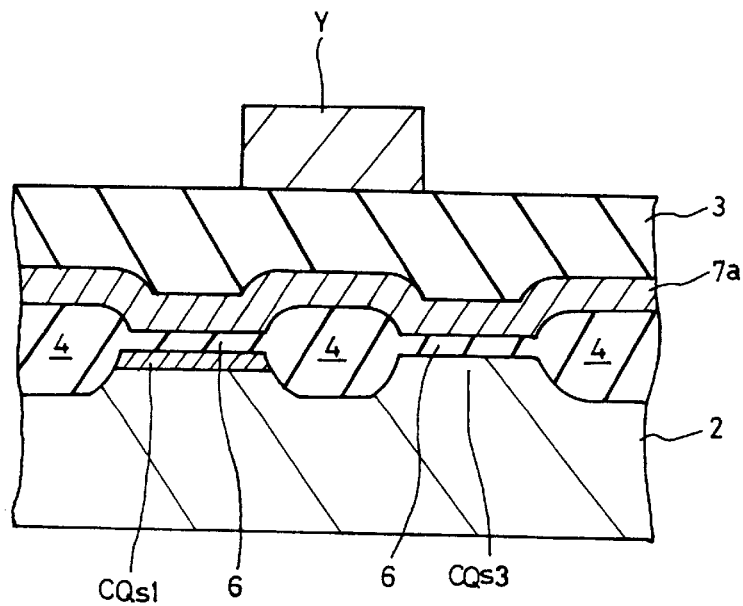
FIG. 4 is a cross-sectional view taken along line B—B of FIG. 2.
Figure 5:
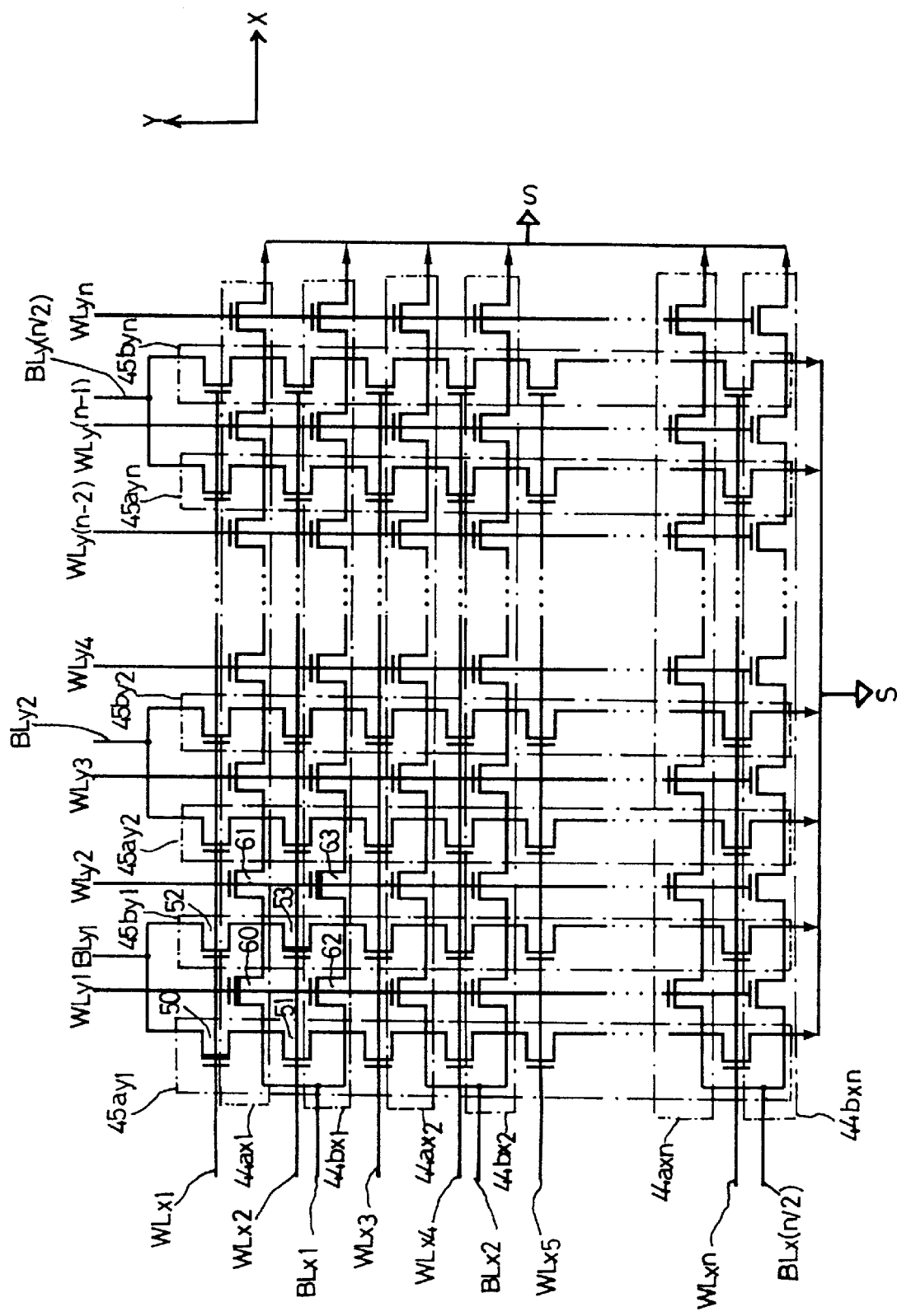
FIG. 5 is a circuit diagram showing the arrangement of a semiconductor memory with NAND cells according to the preferred embodiment of the present invention.

FIG. 5 illustrates a circuit diagram of a NAND cell memory array having a plurality of first and second memory blocks. Each memory block of the first memory blocks comprises a first plurality of pairs of memory sub-blocks $44a_{x1}$ and $44b_{x1}$, $44a_{x2}$ and $44b_{x2}$ . . . $44a_{xn}$ and $44b_{nx}$, arranged in the X-direction. Each memory block of the second memory blocks comprises a second plurality of pairs of memory sub-blocks $45a_{y1}$ and $45b_{y1}$, $45a_{y2}$ and $45b_{y2}$ . . . $45a_{yn}$ and $45b_{yn}$, arranged in the Y-direction.

The first plurality of pairs of memory sub-blocks $44a_{x1}$ and $44b_{x1}$, $44a_{x2}$ and $44b_{x2}$ . . . $44a_{xn}$ and $44b_{xn}$ is coupled to a first plurality of bit lines $BL_{x1}$–$B_{x(n/2)}$ and the second plurality of pairs of memory sub-blocks $45a_{y1}$ and $45b_{y1}$, $45a_{y2}$ and $45b_{y2}$ . . . $45a_{yn}$ and $45b_{yn}$ is coupled to a second plurality of bit lines $BL_{y1}$–$BL_{y(n/2)}$. The gates of NAND cell transistors of the second plurality of pairs of memory sub-blocks $45a_{y1}$ and $45b_{y1}$, $45a_{y2}$ and $45b_{y2}$ . . . $45a_{yn}$ and $45b_{yn}$ are coupled to a first plurality of word lines $WL_{x1}$–$WL_{xn}$, and the gates of NAND cell transistors of the first plurality of pairs of memory sub-blocks $44a_{x1}$ and $44b_{x1}$, $44a_{x2}$ and $44b_{x2}$ . . . $44a_{xn}$ and $44b_{xn}$ are coupled to a second plurality of word lines $WL_{y1}$–$WL_{yn}$.

With reference to pair of memory sub-blocks $44a_{x1}$ and $44b_{x1}$, transistors 60 and 62 having gates connected to the word line $WL_{y1}$ are a depletion mode transistor and an enhancement mode transistor, respectively. Transistors 61 and 63 having gates connected to the word line $WL_{y2}$ are enhancement and depletion mode transistors, respectively. With reference to pair of memory sub-blocks $45a_{y1}$ and $45b_{y1}$, transistors 50 and 52 having gates coupled to the word line $WL_{x1}$ are depletion mode and enhancement mode transistors, respectively. Transistors 51 and 53 having gates coupled to the word line $WL_{x2}$ are enhancement mode and depletion mode transistors, respectively. Decoded control signals are applied to word lines $WL_{y1}$ and $WL_{y2}$ and word lines $WL_{x1}$ and $WL_{x2}$ to select one of the pair of memory sub-blocks $44a_{x1}$ and $44b_{x1}$ and one of pair of memory sub-blocks $45a_{x1}$ and $45b_{x1}$, respectively.

If an appropriate voltage is applied to the corresponding bit line and word line, one of the NAND cell memory sub-blocks in the X and Y direction is selected. Data "0" or "1" is output according to the input signal state of the selected NAND cell memory sub-block. For example, if a low voltage level is applied to the word line $WL_{y1}$, and a high voltage level is applied to the word line $WL_{y2}$, the memory memory sub-block $44a_{x1}$ is selected. On the other hand, if a high voltage level is applied to the word line $Wl_{y1}$, and a low voltage level is applied to the word line $WL_{y2}$, the memory sub-block $44b_{x1}$ is selected. A high voltage level is preferably a source voltage of Vcc, and a low voltage level is preferably a reverse voltage of −Vcc. By doing so, the current of the first bit line $BL_{x1}$ is prevented from going into the ground through the depletion transistors 40 and 43 of the NAND cell arranged in the Y direction.

A voltage of Vcc is applied to the gate or word lines $WL_x$, and reverse voltage of −Vcc is applied to the gate or word lines $WL_y$ in order to select the NAND cells arranged in the Y direction. By doing so, the current of the second bit line is prevented from going into the ground through the depletion transistor of the NAND cell arranged in the X direction. The depletion transistors of the NAND cell are in ON state. However, if a negative voltage is applied to the depletion transistor, its channel becomes non-conductive.

When the NAND cell memory block arranged in the X or Y direction is selected, and if the word lines $WL_{x3}$–$WL_{xn}$ or $WL_{y3}$–$WL_{yn}$ all in "HIGH" state, the transistors of the NAND cell memory sub-blocks are all in ON state, and the bit lines $BL_{x1}$–$BL_{x(n/2)}$ or $BL_{y2}$–$BL_{y(n/2)}$ connect the bit line voltage to the ground. Accordingly, the bit line voltage drops to a "LOW" state, to thereby recognize data stored as "0". If there is at least one signal in "LOW" state among the word lines $WL_{x3}$–$WL_{xn}$ or $WL_{y3}$–$WL_{ny}$, the bit line and the ground of the NAND gate are not connected to each other. This maintains the bit line voltage, to thereby recognize data stored as "1". Data "0" and "1" may be reversely recognized according to the state of the peripheral circuit of the cell array.

In case that the NAND cell memory block array consists of enhancement type transistors, and if a "HIGH" signal is applied to all the gate or word lines (in case of NMOS transistor), both sides of the NAND cell are connected to each other. However, in case that coding is accomplished during its fabrication process according to a user's demand, the NAND cell transistor is turned on without regard to "HIGH" or "LOW" state of the gate or word line of the depletion transistor. Accordingly, the output of the NAND cell is changed according to its input state.

Figure 6:
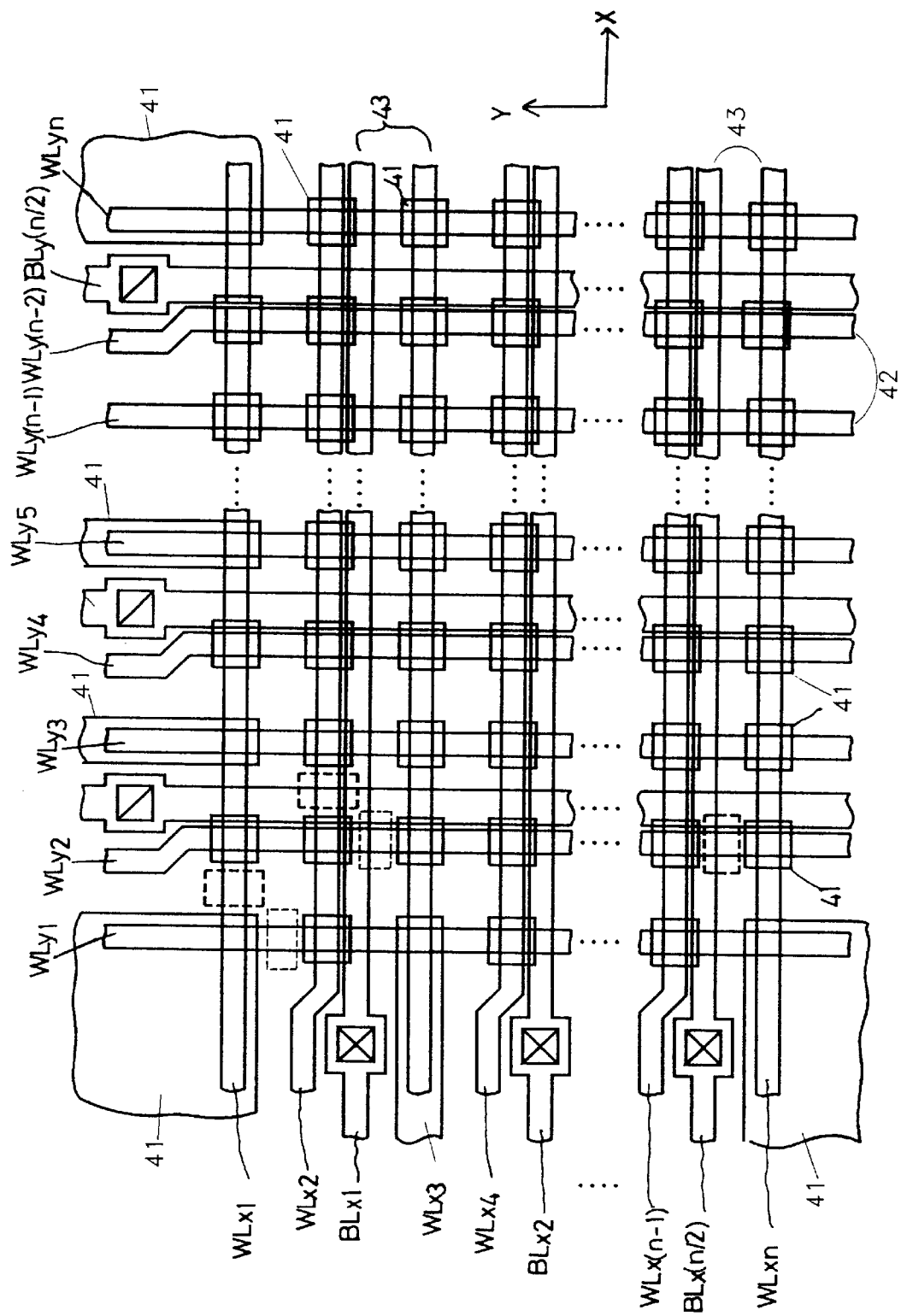
FIG. 6 is a plan view of FIG. 5.

A method for fabricating the NAND cell of the present invention will be explained below with reference to FIG. 6. First, a plurality of field insulating layers are formed in a portion of active regions in the shape of an island. By doing so, active region 43 arranged in the X direction and active region 42 arranged in the Y direction are intersected to each other A portion excluding the active regions becomes an isolation region 41.

Then, ion implantation is carried out to control the threshold voltage, and impurities are ion-implanted for the purpose of forming a depletion transistor. The square shown in dotted line of FIG. 6 designates a region in which the depletion transistor will be formed. Thereafter, gate or word lines $WL_{y1}$–$WL_{yn}$ are formed in the Y direction to be perpendicular to active region 43 arranged in the X direction. An interlevel insulating layer is formed, and the word or gate lines $Wl_{x1}$–$Wl_{xn}$ are formed in the X direction to be perpendicular to active region 42 arranged in the Y direction. The gate or word lines are patterned through photolithography.

Then, impurities are ion-implanted using the gate or word lines as a mask to form source and drain regions. By doing so, impurities are implanted into active regions which are not covered by the gate or words, and thus these active regions become conductive regions. Thereafter, ion implantation is carried out for the purpose of ROM-coding according to a user's demand. Here, the ion implantation is performed in a condition of a thick photomask and large ion implantation intensity, to thereby implant impurity ions into a channel region placed under the gate or word line. This ion implantation may be carried out right after the ion implantation for controlling the threshold voltage, or during the formation of the gate or word.

Thereafter, an interlevel insulating layer is formed, and a contact hole is formed on a portion in which two active regions 43 arranged in the X direction are connected to each other. A conductive layer, for example, metal layer, is formed and patterned to form the bit lines, e.g., $BL_{x1}$–$BL_{x(n/2)}$. An interlevel insulating layer is formed, and a contact hole is formed on a portion in which two active regions 42 arranged in the Y direction are connected to each other. A conductive layer is formed and patterned to form the bit lines, e.g., $BL_{y1}$–$BL_{y(n/2)}$. The interlevel insulating layer is formed of a high temperature low pressure dielectric (HLD), BPSG or plasma enhanced chemical vapor deposition (PECVD) oxide layer. Then, a passivation, packaging process or the like is carried out to accomplish the NAND cell.

According to the present invention, the word lines and active regions are arranged in the X and Y directions. By doing so, when Vcc is applied to the word line in the X direction, −Vcc is applied to the word line in the Y direction to turn off all channels placed under the word lines in the Y direction, thereby blocking the current path. Also, when Vcc is applied to the word line in the Y direction, −Vcc is applied to the word line in the X direction to turn off all channels placed under the word lines in the X direction, thereby blocking the current path. Accordingly, it is possible to double the integration of the device.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A NAND cell memory block array comprising: first and second pluralities of memory blocks perpendicularly arranged in first and second directions, each of said first and second pluralities of memory blocks having a plurality of transistors, said transistors being serially connected to one another.

2. The NAND cell memory block array of claim 1, wherein said first plurality of memory blocks arranged in said first direction are connected to each bit line in pairs, said second plurality of memory blocks arranged in said second direction being connected to each bit line in pairs.

3. The NAND cell memory block array of claim 1, wherein said transistors are one of NMOS enhancement transistors and NMOS depletion transistors, said depletion transistor's threshold voltage being approximately −1 v.

4. A method for forming a NAND cell memory block array, comprising the steps of:
  (a) forming a field insulating layer to perpendicularly arrange active regions in first and second directions, said active region having the shape of strip;
  (b) forming an impurity region in a portion in which a depletion transistor is formed;
  (c) forming a first gate in the first direction;
  (d) forming an insulating layer, and forming a second gate perpendicular to said first direction; and
  (e) implanting impurities into said active region placed on both sides of said first and second gate lines, to form source and drain regions.

5. The method of claim 4, wherein, in said step (a), said field insulating layer is not formed on one edge of said active region to connect two active regions at their edges.

6. The method of claim 4 further comprising the step of ion implantation for controlling the threshold voltage of said depletion transistor prior to step (b).

7. The method of claim 6, wherein ion implantation for coding data to a NAND cell is carried out together with said ion implantation for controlling the threshold voltage.

8. The method of claim 4 further comprising the step of ion implantation for coding data to a NAND cell after step (e).

9. The method of claim 4 further comprising the steps of forming an insulating layer, forming a contact hole, and depositing and patterning a conductive material to form a conductive line after step (e).

10. The method of claim 9, wherein said insulating layer is formed of a silicon oxide layer, said conductive material is metal, and said steps of forming an insulating layer, forming a contact hole, and depositing and patterning a conductive material to form a conductive line are carried out two times, to form first and second metal lines.

11. A memory array comprising:
  a first plurality of memory blocks arranged in a first direction; and
  a second plurality of memory blocks arranged in a second direction which is different from the first direction, wherein each memory block includes a pair of memory sub-blocks, and each memory sub-block of said first plurality of memory blocks intersects each memory sub-block of said second plurality of memory blocks.

12. The memory array of claim 11, wherein each memory sub-block comprises a plurality of transistors coupled in series, and each pair of memory sub-blocks is coupled to a bit line.

13. The memory device of claim 11, wherein said first and second pluralities of memory blocks intersect at substantially at a right angle.

14. The memory array of claim 12, wherein said plurality of transistors comprises at least one of an enhancement mode transistor and a depletion mode transistor.

* * * * *